United States Patent [19]

Fang

[11] Patent Number: 5,548,250
[45] Date of Patent: Aug. 20, 1996

[54] LOW POWER PHASE LOCK LOOP CLOCKING CIRCUIT FOR BATTERY POWERED SYSTEMS

[75] Inventor: Wen Fang, Fremont, Calif.

[73] Assignee: Cirrus Logic, Inc., Fremont, Calif.

[21] Appl. No.: 368,863

[22] Filed: Jan. 5, 1995

[51] Int. Cl.[6] .................................. H03L 7/07; H03L 7/08; H03L 7/10; H03L 7/16
[52] U.S. Cl. .................................. 331/14; 331/1 A; 331/2; 331/17; 331/25; 327/105; 327/147; 327/156; 360/51; 375/376; 455/260
[58] Field of Search .................................. 331/1 A, 2, 10, 331/14, 15, 17, 18, 25, 173, DIG. 2; 327/105, 147, 148, 150, 156, 157, 159; 360/51; 375/120; 455/260

[56] References Cited

U.S. PATENT DOCUMENTS

| | | | |
|---|---|---|---|
| 4,816,776 | 3/1989 | Kessler | 331/64 X |
| 4,914,695 | 4/1990 | Martin | 331/14 X |
| 5,339,278 | 8/1994 | Irwin et al. | 331/16 |
| 5,373,254 | 12/1994 | Nakauchi et al. | 331/14 X |
| 5,396,521 | 3/1995 | Minami | 331/14 X |

*Primary Examiner*—David Mis
*Attorney, Agent, or Firm*—Haverstock & Associates

[57] ABSTRACT

According to the present invention, a PLL circuit is designed to include an active mode, a sleep mode and an idle mode. In the idle mode, the PLL draws substantially less power than that in the active mode. In order to return to the designed operating frequency immediately, the PLL periodically refreshes itself in this mode of operation. The power consumption of the PLL is dependent upon the ratio of on-time to off-time which is a fraction of the power consumed in the active mode. Preferably, the PLL is designed to receive an external clock signal as a reference clock from which it develops the internal system clock. The PLL also receives a lower frequency refresh signal for activating a refresh operation during the idle mode. The PLL can power itself down after completing a single phase compare operation. The refresh signal which can be derived from a real time clock must be synchronized to the external reference clock. Thus, the PLL includes a zero-phase-restart circuit.

19 Claims, 5 Drawing Sheets

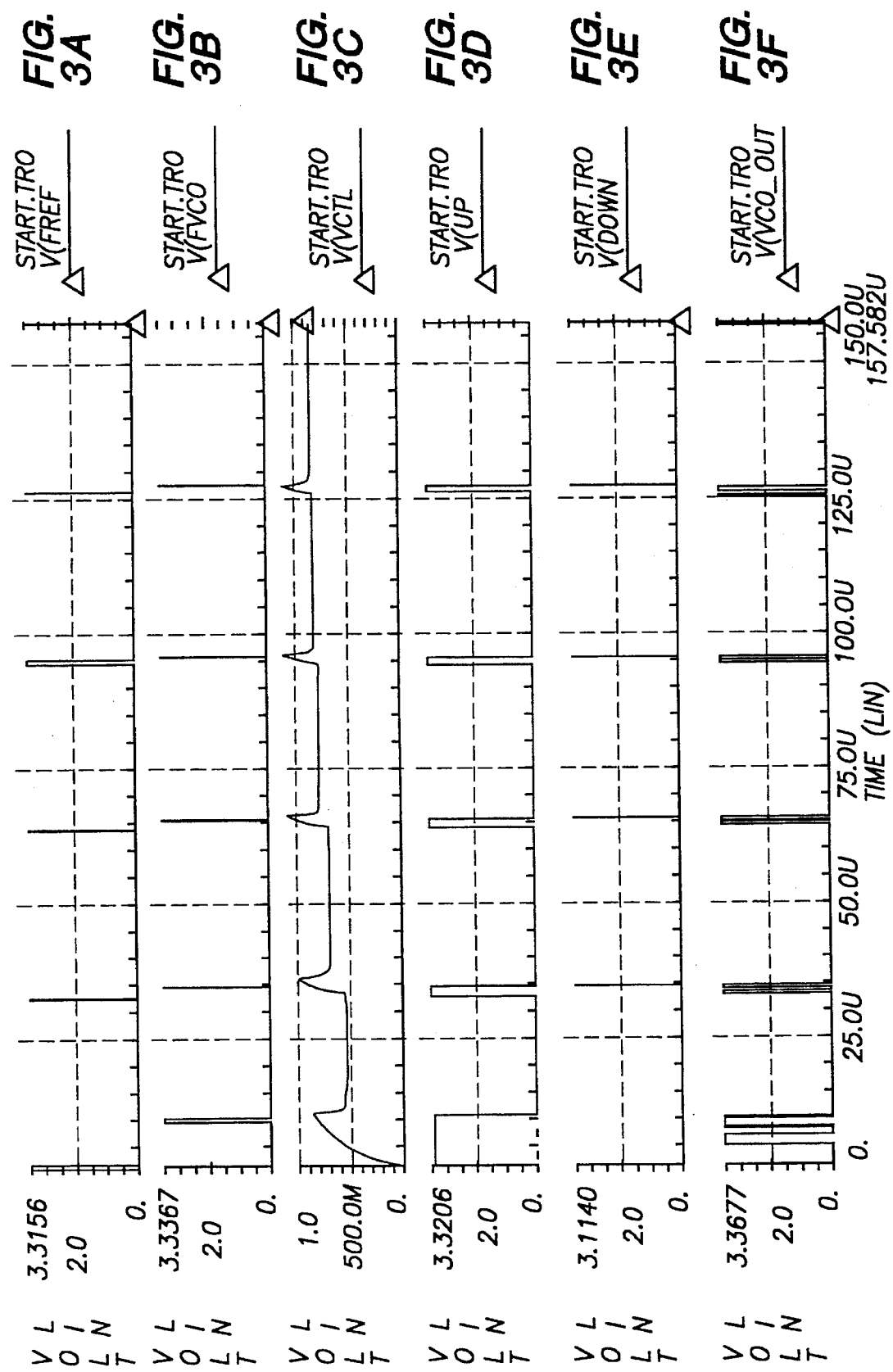

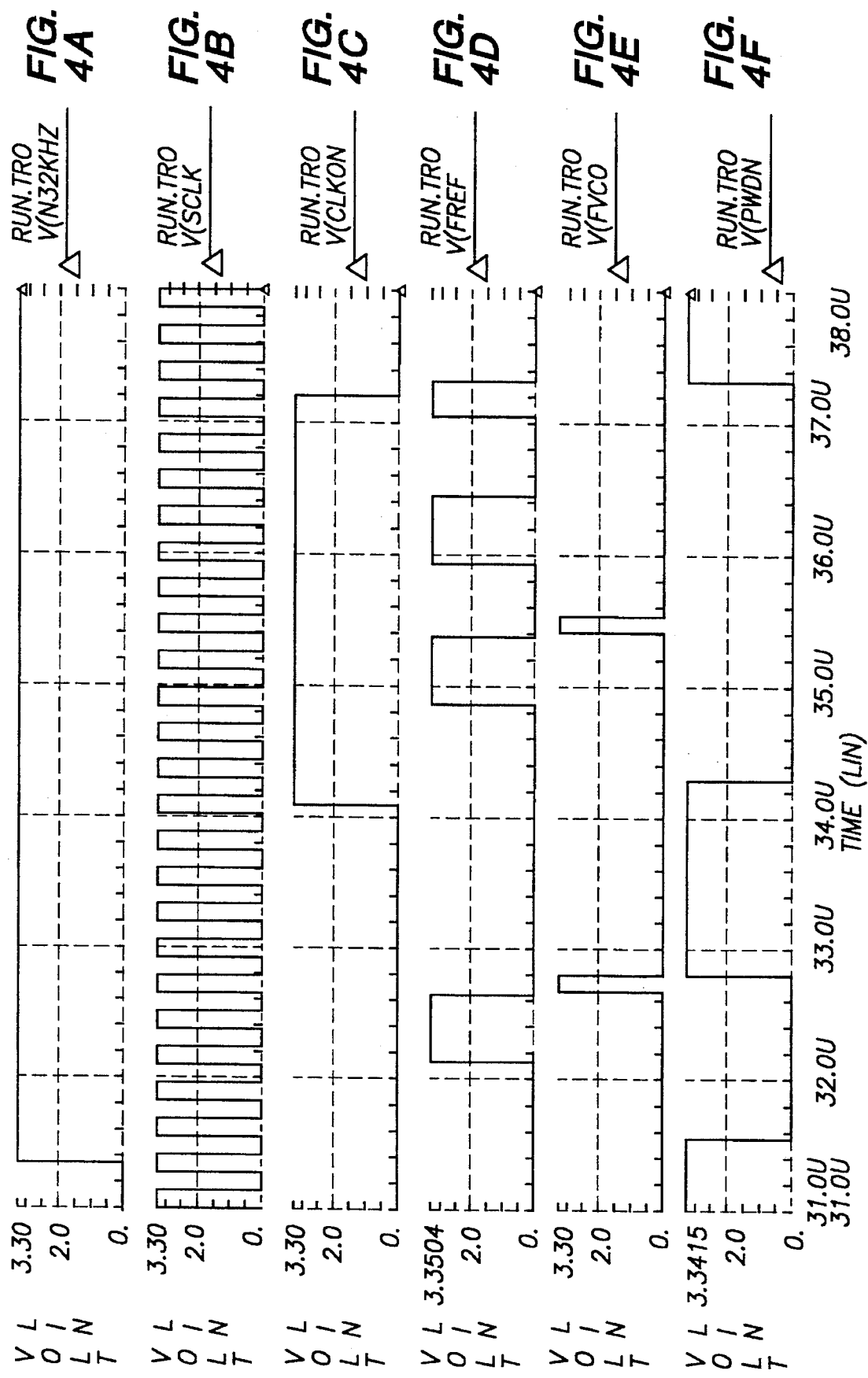

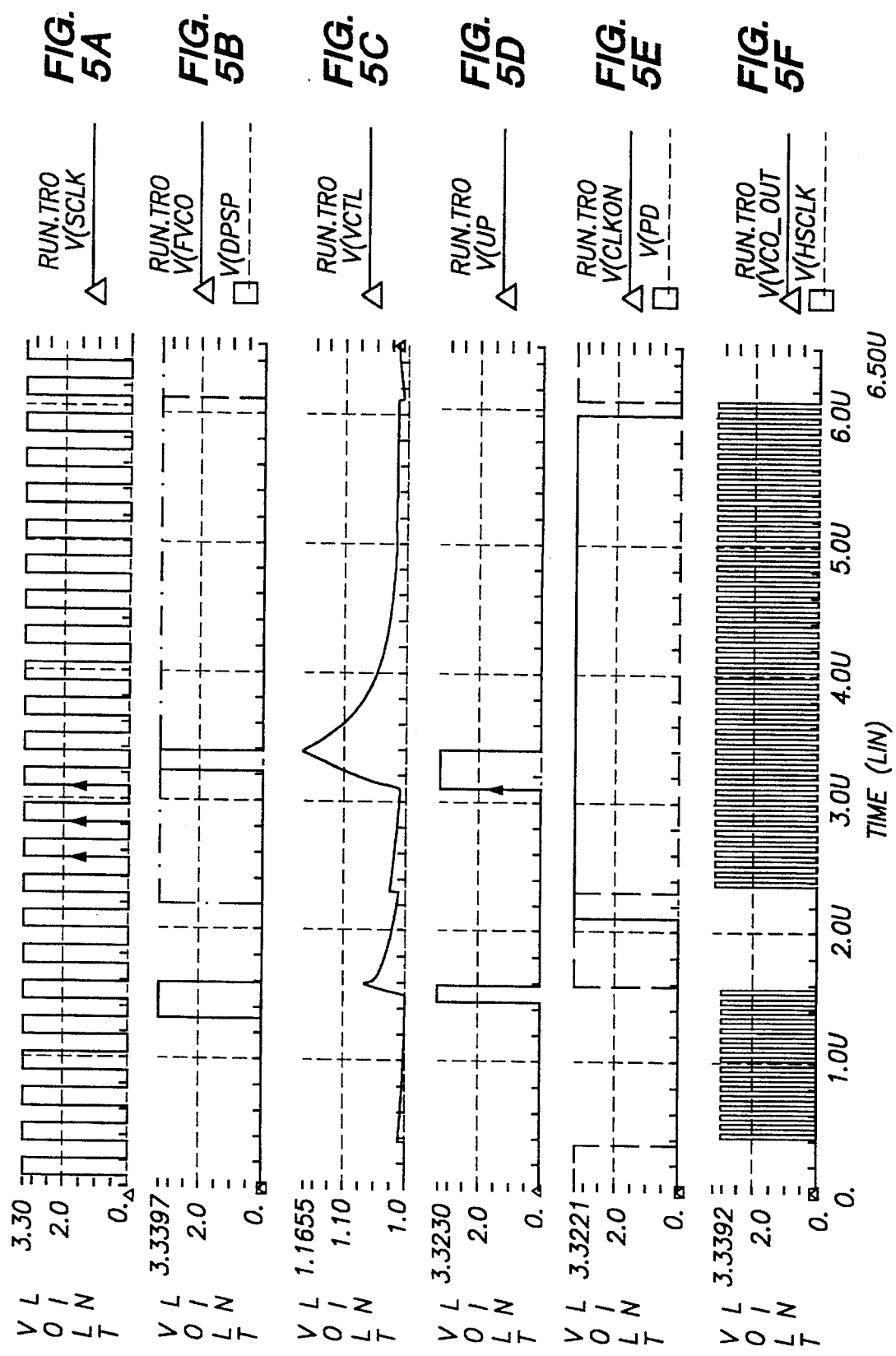

5,548,250

LOW POWER PHASE LOCK LOOP CLOCKING CIRCUIT FOR BATTERY POWERED SYSTEMS

FIELD OF THE INVENTION

This invention relates generally to electronic systems having selective applications of a clock generation or recovery system. More particularly, the invention preferably relates to an integrated circuit design powering down a PLL when the electronic system does not require a clock signal. However, unlike a conventional PLL, the PLL in this invention refreshes itself using a low frequency clock so that the PLL can resume operation at the desired phase and frequency immediately.

BACKGROUND OF THE INVENTION

For reasons of portability and convenience, more and more systems are being designed for use with battery power rather than line power. Unfortunately, such systems cause inconvenience to the user because the batteries must either be replaced or recharged periodically. Even for an electronic system powered by line, it is also desirable to reduce the power consumption thereby reduce the heat dissipated for reliability reasons. As a result, it is a common goal to design circuits that consume less power. Examples of systems where low power consumption is being actively sought include portable computers such as laptop or palmtop computers, personal digital assistants (PDAs), and wireless communications devices such as cellular telephones and pagers.

In the field of integrated circuits, a commonly used technique for reducing power consumption is to manufacture the circuit using CMOS circuit technology. CMOS circuits have the advantage that there is no path for current to flow in a steady state condition. However, it is well known that even CMOS circuits provide a current path during a transition from one logical state to another.

Within each electronic system or integrated circuit, there are many sub-circuits or functional blocks which all work together to perform desired operations. Each sub-circuit in the system is synchronized by a clock. For certain types of circuits, including CMOS circuits, power consumption is increased when the circuits are exercised by a clock signal. As a result of the clock signal, even CMOS circuits draw power.

In order to reduce the power consumption of electronic systems, the frequency of the system clock can be reduced when high speed operation is not required in some applications. This can be achieved by using a PLL whose output frequency can be changed easily compared to a fixed frequency generated by a crystal oscillator. When high speed operation is required for certain applications, the clock frequency generated by a PLL can be increased.

Typical electronic systems employ multiple integrated circuit chips or functional blocks. Each chip or block typically performs a limited number of functions for the system, for example, to control a semiconductor memory, to control a hard disk, to control a screen display and other related functions. Periodically, some of these circuits are not needed and are inactive insofar as system functionality is concerned. To save power further, the clock signal to such circuits can be disabled during the idle period. While this does reduce power consumption, the circuit that generates the clock signal still operates and thus draws power.

One method used to reduce the time that the clock signal is supplied to an integrated circuit is used in PCMCIA Host Adapters, part Nos. C1-PD6710/PD672X, which are supplied by Cirrus Logic, Inc. of Fremont, Calif. This method teaches simultaneously disabling the clock signal to all of the functional blocks, after all of the functional blocks have signalled that they no longer require the clock signal. An arbiter circuit then monitors the system bus and will re-enable the clock signal to all of the functional blocks simultaneously, when an address within the range controlled by the arbiter and a corresponding command are present on the system bus. The disadvantage of this system is that the power savings can only be realized when the entire circuits of the C1-PD6710/PD672X become temporarily inactive.

The reason not to power down the PLL when the output of the PLL is disabled is that a conventional PLL cannot output the desired frequency immediately after the power down period. With conventional PLL, when the PLL is enabled after a power-down reset period, it can take up to 30 phase comparisons to regain the designed frequency. A phase comparison usually takes about 1 μS depending on the reference frequency so that the PLL can only recover in approximately 30 μS. This recovery time may be too slow for certain applications. In addition, the lengthy recovery time also prevents the PLL from powering down as often as possible to reduce the power consumption.

Another unrelated problem also presently exists for designers of integrated circuits. It is generally not possible to build an integrated circuit that includes two PLLs. Cross talk between the two PLLs prevents the two circuits from maintaining their respective designed frequencies. As discussed above, there is a significant delay in restarting a PLL from rest. Thus, it has not been practical to design an integrated circuit with two PLLs and alternatively deactivate one PLL; it takes too long for the clock signal to regain the desired frequency.

What is needed is a PLL circuit that can be temporarily disabled in order to reduce the power consumption. However, the PLL can be activated again and resume operation immediately at its designed frequency. It is further desirable that during a power-down idle mode, the PLL can be activated for a single phase comparison (refresh itself) and then de-activate again automatically.

SUMMARY OF THE INVENTION

According to the present invention, a PLL circuit is designed to include an active mode, a sleep mode and an idle mode. During the idle mode, the PLL draws a minimum of power. In order to provide for a substantially immediate return to the designed operating frequency, the PLL periodically refreshes itself. Preferably, the PLL is designed to receive an external clock signal from which it develops the internal system clock. The PLL also receives a lower frequency refresh signal for activating a refresh operation during the idle mode. The amount of power savings is dependent upon the ratio of on time to off time. The PLL is designed to turn on and off frequently. The PLL can deactivate itself after a single compare operation. The refresh signal need not be synchronized to the external reference clock. Thus, the PLL includes a zero-phase-restart circuit.

According to the present invention, a PLL circuit is designed to include an active mode, a sleep mode and an idle mode. In the active mode, the PLL operates as a conventional PLL and draws a maximum of power. In the sleep mode, the PLL is powered down completely and draws no power. In the idle mode, the PLL draws substantially less power than that in the active mode. In order to return to the designed operating frequency immediately, the PLL periodically refreshes itself in this mode of operation. The power consumption of the PLL is dependent upon the ratio of on-time to off-time which is a fraction of the power consumed in the active mode.

Preferably, the PLL is designed to receive an external clock signal as a reference clock from which it develops the internal system clock. The PLL also receives a lower frequency refresh signal for activating a refresh operation during the idle mode. The PLL can power itself down after completing a single phase compare operation. The refresh signal which can be derived from a real time clock must be synchronized to the external reference clock. Thus, the PLL includes a zero-phase-restart circuit.

BRIEF DESCRIPTION OF THE DRAWINGS

FIG. 3 shows a timing diagram of a simulation of a circuit built according to the block diagram of FIG. 2.

FIG. 4 shows an expanded timing diagram of the simulation of FIG. 3.

FIG. 5 shows a timing diagram of a simulation of the zero phase restart of a circuit built according to the block diagram of FIG. 2.

DETAILED DESCRIPTION OF THE PREFERRED EMBODIMENT

Figure 1:
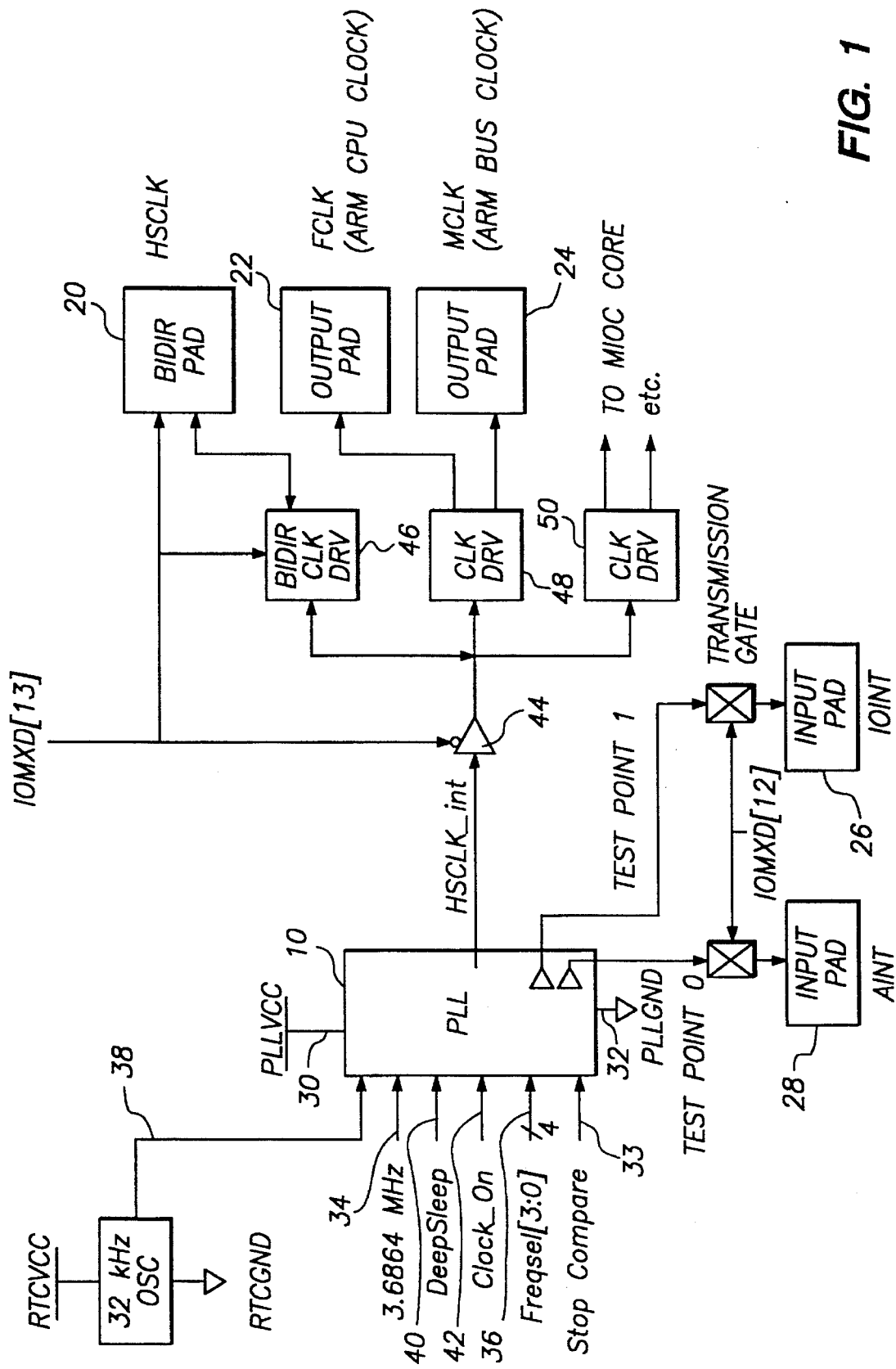
FIG. 1 illustrates a block diagram of the low power clocking apparatus of the present invention.

The preferred embodiment of the present invention provides a PLL that includes a low power idle mode. FIG. 1 shows a block diagram that comprises the PLL 10 of the present invention. The PLL 10 is designed to form part of an integrated circuit. Accordingly, there are access points to circuits that are external to the integrated circuit known in the art as bonding pads 20, 22, 24, 26 and 28.

The PLL 10 is designed to have three modes of operation: a normal running mode, a deep sleep mode and an idle mode. The running mode is used to generate a clock output signal HSCLK. In this mode, the PLL 10 receives an external high frequency clock signal as a reference clock 34. In response to the reference clock signal, the PLL generates the output clock signal HSCLK.

In the deep sleep mode, the PLL is designed to consume the minimum power. All circuits in the PLL 10 are powered down in this mode of operation. As such there are no paths drawing current in the PLL and thus power consumption is almost zero.

When the PLL is in the idle mode of operation, it is designed to consume significantly less power while being conditioned to resume generation of the designed clock frequency essentially immediately. To achieve this goal, the PLL periodically refreshes itself when it is activated by the real-time clock 38.

According to the preferred embodiment, the PLL 10 is designed to receive eleven inputs. As is well understood, the PLL 10 includes a power input PLLVCC 30 and a ground input PLLGND 32. The PLL 10 receives a high frequency clock signal 34 as the reference clock and a low frequency clock 38 as a refresh clock. The PLL also receives a stop compare signal 33 which prevents comparisons and thereby avoid adjusting the VCO.

The PLL 10 is configured to receive a four bit control signal FreqSel over the bus 36. The control signal FreqSel 36 is used by the PLL 10 to select the frequency of its output clock signal HSCLK. The output frequency of HSCLK can be selected from among ten possible frequencies from 16.5888 MHz to 41.4720 MHz in 2.7648 MHz increments, although it is not necessarily limited to these frequencies.

The PLL 10 also receives two control signals: the DeepSleep signal 40 and the Clock_On signal 42. These two signals configure the PLL to operate in one of the three modes. In the preferred embodiment, if the DeepSleep signal 40 is in a logical "1" state, the PLL 10 is inactive, the output clock signal HSCLK remains low and the PLL is powered down. In this sleep mode, the logical state of the Clock_On signal 42 does not matter.

If the DeepSleep signal 40 is in a logical "0" state, then the Clock_On signal 42 determines the mode of operation of the PLL 10. If the Clock_On signal 42 is in a logical "1" state, then the PLL 10 is running, and the output frequency is determined by the frequency control signal 36 as described above. On the other hand, if the Clock On signal 42 is in a logical "0" state, then the PLL 10 is in the idle mode.

In the idle mode, the PLL receives a low frequency signal that initiates the refresh operation. In the preferred embodiment, the refresh signal is taken from 32 KHz real time clock 38 which is never powered down. Naturally other frequencies can be selected without departing from the spirit and scope of the invention. In the running mode using this 3.6864 MHz clock, the power consumption is approximately 10 mA. The average power consumption in the idle mode using a 32 KHz refresh frequency is approximately 500 µA, or about 1/20 of the running mode power consumption. The average power consumption can be further reduced by selecting a slower refresh clock signal.

In order to refresh the PLL correctly, the refresh signal 38 must be synchronized with the reference clock 34. Upon receiving a refresh signal 38, the PLL 10 synchronizes it with the reference clock 34 and compares the phases between the reference clock and the VCO output clock. The charge is pumped up or down depending on the phase difference to adjust the VCO control voltage at the desired frequency and then the PLL shuts itself down automatically.

Figure 2:
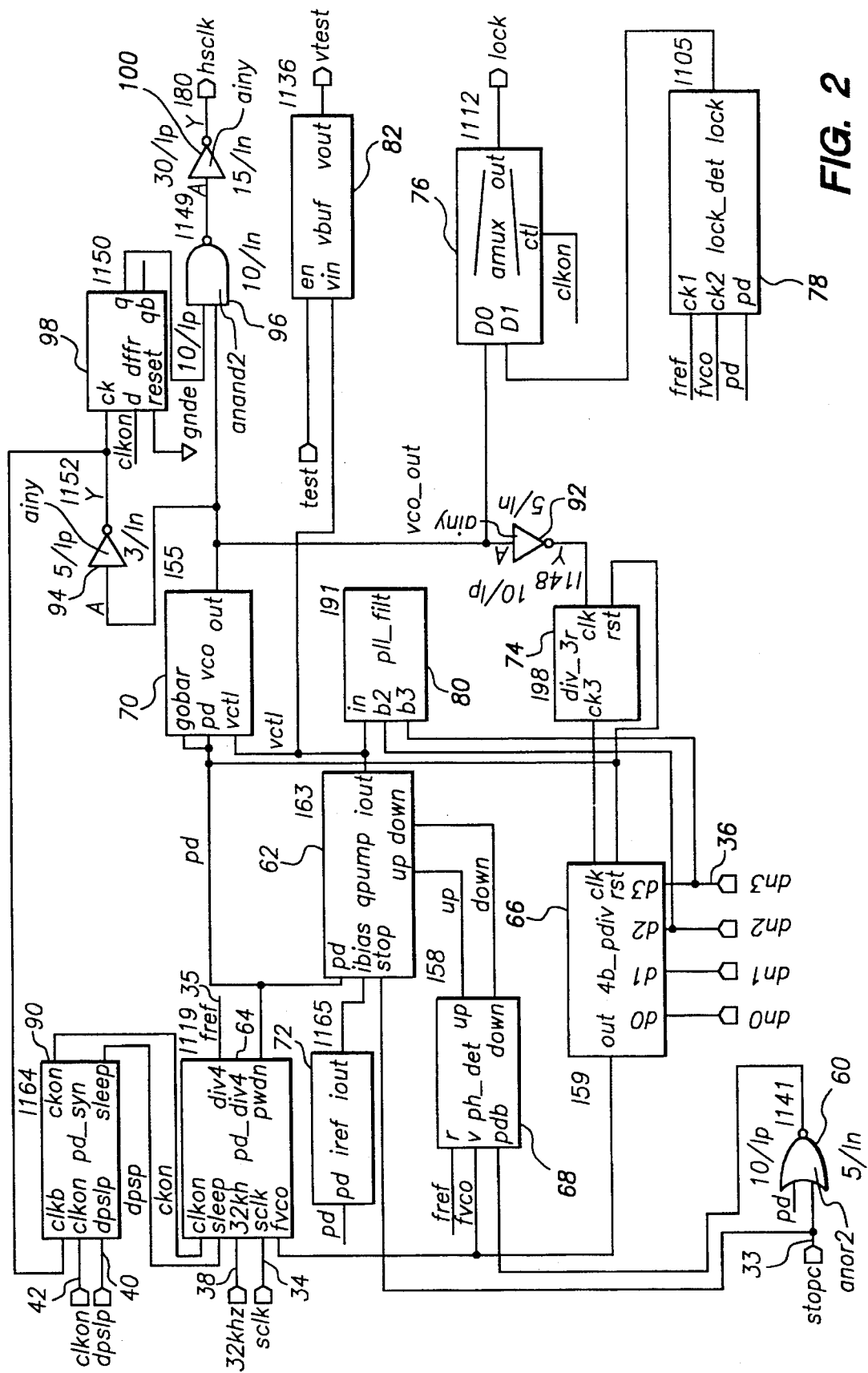
FIG. 2 illustrates a more detailed block diagram circuit of FIG. 1.

FIG. 2 shows a more detailed block diagram of the PLL 10 of FIG. 1. As can readily be seen, the circuit of FIG. 2 includes the same input signals as that of FIG. 1. Note that the power and ground signals are not shown. Persons of ordinary skill in the art will readily understand that such signals must be present for the circuit to operate.

The stop compare signal 33 is coupled as an input to a two input NOR gate 60 and to the charge pump circuit 62. The high frequency clock signal 34 is coupled to the power down divide by four circuit 64 to generate the reference clock fref. The low frequency clock 38 is also coupled to the power down divide by four circuit 64 to synchronize the refresh operation with the reference clock. The frequency select signal, FreqSel 36 are coupled to the four bit frequency divide circuit 66. The output of the four bit frequency divide circuit 66 and the output of the divided reference clock 35 are coupled as inputs to the phase detect circuit 68 to detect any phase difference between them. The output of the four bit phase divide circuit 66 is also coupled as an input to the power down divide by four circuit 64 and as an input to a lock detect circuit 78.

The DeepSleep signal 40 and the Clock_On signal 42 are coupled as inputs to the power down synchronizer circuit 90 to be synchronized with the internal clock. The Clock_On signal 42 is also coupled as an input to a multiplexer output circuit 76 for testing and to a D-type flip flop circuit 98 for output clock synchronization. The synchronized outputs ckon and sleep signals are coupled as inputs to the power down circuit 64. In response to its inputs, the power down divide by four circuit 64 either generates an internal power down signal pd or a frequency reference fref. If the PLL is in the power down mode, the signal pd is coupled as an input to the NOR 60, to the charge pump 62, to the VCO 70, to a current reference circuit 72 as a power down signal, and to the lock detect circuit 78, to the four bit frequency divide circuit 66, to a divide by three circuit 74 as a reset signal.

The output of the current reference circuit 72 is to generate a constant reference current to the charge pump 62. The output of the charge pump 62 is coupled as an input to the VCO 70, to the PLL filter capacitors 80 and to a voltage buffer test circuit 82. The capacitors of the PLL filter 80 will temporarily store the voltage necessary to drive the VCO 70 at the desired frequency. By periodically refreshing the PLL during the idle mode, that voltage stored on the capacitors of the PLL filter 80 is maintained thereby allowing the PLL to immediately resume operating at the desired frequency. The two most significant bits of the frequency control signal 36 are coupled to the PLL filter so that the filter is more accurately tuned to the frequency selected by the frequency control signal 36.

The frequency reference signal fref output of the power down divide by four circuit 64 is coupled as an input to the phase detector circuit 68, to the lock detect circuit 78. The phase detector 68 has two outputs: an up output and a down output. They are coupled as inputs to the charge pump 62 to control the frequency of the VCO 70.

The output of the VCO 70 is coupled as an input to the multiplexer output circuit 76, to two inverting buffers 92 and 94 and to a two input NAND gate 96. The output of the buffer 92 is coupled as a clock input to the divide by three circuit 74. The output of the buffer 94 is coupled as an input to the power down synchronizer 90 and to the D-type flip-flop circuit 98. The output of the flip-flop 98 is coupled as an input to the NAND gate 96. The output of the NAND gate 96 is coupled to an inverting buffer 100 whose output is the output signal HSCLK. The purpose of these circuits is to synchronize the external control signal clkon 42 with the internal VCO clock.

The other outputs of the PLL circuit, a voltage buffer 82 and a multiplexer 76, are for test purposes only. The lock detect circuit 78 compares the phases of the reference frequency fref and VCO output frequency fvco, and generates the lock signal when these two frequencies are in phase. The output of the lock detect circuit 78 is coupled as an input to the multiplexer output circuit 76.

FIG. 3 shows a timing diagram of a simulation of a circuit built according to the block diagram of FIG. 2. In the diagram of FIG. 3, the PLL is operating in the idle mode. Timing diagrams for six signals in FIG. 2 are presented. The top (first) timing chart in FIG. 3 represents the signal on the fref output of the power down divide by four circuit 64. The second timing chart on FIG. 3 shows the output signal of the four bit frequency divide circuit 66. The third timing chart of FIG. 3 shows the VCO control voltage on the capacitor of the filter. The fourth timing chart shows the up input to the charge pump 62 and the fifth timing chart shows the down input. The sixth timing chart shows the output of the VCO 70. As can readily be seen, the control voltage for the VCO (third timing chart) is low at the beginning of the simulation. Thus, the output frequency of the VCO is low. The PLL detects this and sends the up signal high for a long period relative to the down signal. As the control voltage for the VCO approaches the correct level, the duration of the up signal diminishes.

FIG. 4 shows the same simulation results of FIG. 3 on an expanded time scale up to 2 µS. The external reference clock is shown in the top diagram of FIG. 4. The fifth timing chart shows that the PLL refreshes itself when cklon is low (solid line) and power itself down automatically after a phase comparison. The output frequency of the VCO increases as the result of the up signal.

The PLL enters the active mode at 2.1 µS when clkon goes high as shown a solid line in the fifth timing chart of FIG. 4. The PLL outputs hsclk continuously as seen in the sixth timing chart. The PLL enters the sleep mode at 6 µS when DPSP (DeepSleep) goes high as seen as a dashed line in the second timing chart and the PLL outputs zero as shown in the sixth timing chart.

FIG. 5 shows the zero-phase-restart operation of the PLL of the present invention. Because it is possible for the reference clock and the refresh clock to be out of synchronization, conventional designs would not allow the circuit to refresh or restart properly. FIG. 5 shows the low frequency refresh clock in the first (top) timing chart and the high frequency reference clock in the second timing chart. When the low frequency refresh signal becomes high as shown in the top timing chart, the power down output signal PWDN of power down divide by four 64 (FIG. 2) does not go to low immediately until the rising edge of the reference clock SCLK.

Similarly, when the clkon signal in the third timing chart goes to high indicating an active mode, the power down signal PWDN does not switch to low immediately until the rising edge of the SCLK as shown in the sixth timing chart of FIG. 5. Once the PWDN signal is low, the PLL resumes normal running mode operation. These are necessary to synchronize the external signals in order for the PLL to operate correctly.

The techniques described here can also be used to prevent the cross talk problem. When two PLLs are designed on the same integrated circuit chip, the two PLLs can be alternatively switched if only one PLL output is required at any time. The PLL design of the present invention is effective for such an application because it can resume operation at the desired frequency more quickly than PLL circuits in the prior art.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

I claim:

1. A clock signal generating circuit including a phase locked loop circuit wherein the phase locked loop circuit includes a phase detector circuit having means for comparing an output clock signal to a reference signal comprising:

a. a first clock receiving circuit for receiving a first clock signal and coupling it to the phase locked loop circuit;

b. a second clock receiving circuit for receiving a second clock signal and coupling it to the phase locked loop circuit wherein the second clock signal has a lower frequency than the first clock signal;

c. a control circuit coupled for controlling the first phase locked loop circuit for selecting one of two operating modes including:
  (1) a running mode wherein an output clock signal is generated as a function of the first signal; and
  (2) an idle mode wherein a single compare operation is periodically performed in the phase detector circuit.

2. The circuit according to claim 1 further comprising a charge pump coupled to the phase locked loop circuit to adjust a control voltage in response to a phase difference between the first clock signal and the output clock signal.

3. The circuit according to claim 2 further comprising a filter coupled to the charge pump for filtering charge pump induced ripple signals.

4. The circuit according to claim 1 further comprising a voltage controlled oscillator for generating the output clock signal.

5. The circuit according to claim 1 further comprising a third operating circuit including a circuit for disabling all operations of the phase locked loop circuit.

6. The circuit according to claim 1 further comprising means for synchronizing the operation of the circuit when initiating the running mode operation and during a single compare operation while in the idle mode.

7. The circuit according to claim 1 wherein the phase locked loop circuit is formed on an integrated circuit and further wherein the first and the second clock signals are coupled to the integrated circuit from an external source.

8. An integrated circuit having a first clock signal generating circuit, and a second clock generating circuit,
a. wherein the first clock generating circuit comprises:
  (1) a first phase locked loop circuit wherein the first phase locked loop circuit includes a first phase detector circuit having first means for comparing a first output clock signal to a first reference signal;
  (2) a first clock receiving circuit for receiving a first clock signal and coupling it to the first phase locked loop circuit;
  (3) a second clock receiving circuit for receiving a second clock signal and coupling it to the first phase locked loop circuit wherein the second clock signal has a lower frequency than the first clock signal;
  (4) a first control circuit coupled for controlling the first phase locked loop circuit for selecting one of two operating modes including:
    (a) a first running mode wherein an output clock signal is generated as a function of the first clock signal; and
    (b) first idle mode wherein a single compare operation is periodically performed in the phase detector circuit in response to the second clock signal;
b. wherein the second clock generating circuit comprises:
  (1) a second phase locked loop circuit wherein the second phase locked loop circuit includes a second phase detector circuit having second means for comparing a second output clock signal to a second reference signal;
  (2) a third clock receiving circuit for receiving a third clock signal and coupling it to the second phase locked loop circuit;
  (3) a fourth clock receiving circuit for receiving a fourth clock signal and coupling it to the second phase locked loop circuit wherein the fourth clock signal has a lower frequency than the third clock signal;
  (4) a second control circuit coupled for controlling the second phase locked loop circuit for selecting one of two operating modes including:
    (a) a second running mode wherein a second output clock signal is generated as a function of the third clock signal; and
    (b) second idle mode wherein a single compare operation is periodically performed in the phase detector circuit in response to the fourth clock signal; and
c. a third control circuit for selectively activating only one of the first phase locked loop circuit and the second phase locked loop circuit.

9. The circuit according to claim 8 wherein the first and the third clock signals are the same signal.

10. The circuit according to claim 8 wherein the second and the fourth clock signals are the same signal.

11. The circuit according to claim 8 wherein the first phase locked loop circuit further comprises a first charge pump coupled to the first phase locked loop circuit to adjust a first control voltage in response to a phase difference between the first clock signal and the first output clock signal and wherein the second phase locked loop circuit further comprises a second charge pump coupled to the second phase locked loop circuit to adjust a second control voltage in response to a phase difference between the second clock signal and the second output clock signal.

12. The circuit according to claim 11 wherein the first phase locked loop circuit further comprises a first filter coupled to the first charge pump for filtering first charge pump induced ripple signals and wherein the second phase locked loop circuit further comprises a second filter coupled to the second charge pump for filtering second charge pump induced ripple signals.

13. The circuit according to claim 8 wherein the first phase locked loop circuit further comprises a first voltage controlled oscillator for generating the first output clock signal and the second phase locked loop circuit further comprises a second voltage controlled oscillator for generating the second output clock signal.

14. The circuit according to claim 8 further comprising means for synchronizing the operation of each of the phase locked loop circuits when initiating a running mode operation and during a single compare operation while in the idle mode.

15. A clock signal generating circuit comprising:
a. a first clock receiving circuit for receiving a first clock signal and coupling it to the phase locked loop circuit;
b. a second clock receiving circuit for receiving a second clock signal and coupling it to the phase locked loop circuit wherein the second clock signal has a lower frequency than the first clock signal;
c. a phase locked loop circuit including a phase detector circuit for comparing an output clock signal to the first clock signal;
d. a charge pump coupled to the phase locked loop circuit to adjust a control voltage in response to a phase difference between the first clock signal and the output clock signal;
e. a filter coupled to the charge pump for filtering charge pump induced ripple signals; and
f. a control circuit coupled for controlling the phase locked loop circuit for selecting one from among three operating modes including:
  (1) a disabled mode wherein no signals are toggled through the circuit;

(2) a running mode wherein the circuit generates the output clock signal as a function of the first signal; and (3) an idle mode wherein the circuit performs a single compare operation in response to the second clock signal.

16. The circuit according to claim 15 further comprising means for synchronizing the operation of the circuit during a single compare operation while in the idle mode.

17. The circuit according to claim 15 wherein the first phase locked loop circuit is formed on an integrated circuit and further wherein the first and the second clock signals are coupled to the integrated circuit from an external source.

18. The circuit according to claim 15 further comprising a second phase locked loop circuit and a control circuit for selectively activating only one of the first phase locked loop circuit and the second phase locked loop circuit.

19. A method of generating a clock signal using a phase locked loop circuit comprising the steps of:

a. receiving a first clock signal;

b. receiving a second clock signal that has a lower frequency than the first clock signal c. selecting one of three modes of operation including:

(1) generating an output clock signal that is a function of the first clock signal;

(2) disabling the output clock signal; and (3) operating in an idle mode and periodically activating the phase locked loop circuit under control of the second clock signal.

* * * * *